(12) United States Patent
Eisele et al.

(10) Patent No.: US 8,017,446 B2
(45) Date of Patent: Sep. 13, 2011

(54) METHOD FOR MANUFACTURING A RIGID POWER MODULE SUITED FOR HIGH-VOLTAGE APPLICATIONS

(75) Inventors: Ronald Eisele, Surendorf (DE); Mathias Kock, Gokels (DE); Teoman Senyildiz, Schleswig (DE)

(73) Assignee: Danfoss Silicon Power GmbH, Schleswig (DE)

( * ) Notice: Subject to any disclaimer, the term of this patent is extended or adjusted under 35 U.S.C. 154(b) by 0 days.

(21) Appl. No.: 12/730,674

(22) Filed: Mar. 24, 2010

(65) Prior Publication Data
US 2010/0277873 A1 Nov. 4, 2010

(30) Foreign Application Priority Data

Mar. 28, 2009 (DE) .......... 10 2009 014 794

(51) Int. Cl.
*H01L 21/00* (2006.01)
(52) U.S. Cl. ........ 438/123; 438/106; 438/111; 438/125; 438/455; 438/688; 257/E21.48; 257/E21.519; 257/E23.141; 257/E23.049
(58) Field of Classification Search .......... 438/106, 438/111, 123, 125, 455, 688; 257/E21.48, 257/E21.519, E23.141, E23.049
See application file for complete search history.

(56) References Cited

U.S. PATENT DOCUMENTS

| 4,099,200 | A | * | 7/1978 | Koutalides | 257/666 |
| 5,733,802 | A | * | 3/1998 | Inoue et al. | 438/127 |
| 7,055,893 | B2 | | 6/2006 | Yamamura et al. | |
| 2009/0189264 | A1 | * | 7/2009 | Yato et al. | 257/676 |

FOREIGN PATENT DOCUMENTS

| DE | 8908678 | 11/1990 |
| DE | 4330975 | 3/1995 |
| DE | 102004005534 | 9/2004 |
| DE | 102004055534 | 5/2006 |
| DE | 10 2007 020 618 B3 | 10/2008 |
| EP | 1833088 | 9/2007 |
| JP | 2005005638 | 1/2005 |

* cited by examiner

*Primary Examiner* — Michelle Estrada
(74) *Attorney, Agent, or Firm* — McCormick, Paulding & Huber LLP

(57) ABSTRACT

Method for manufacturing a rigid power module with a layer that is electrically insulating and conducts well thermally and has been deposited as a coating, the structure having sprayed-on particles that are fused to each other, of at least one material that is electrically insulating and conducts well thermally, having the following steps:

manufacturing a one-piece lead frame;

populating the lead frame with semiconductor devices, possible passive components, and bonding corresponding connections, inserting the thus populated lead frame into a compression mould so that accessibility of part areas of the lead frame is ensured, pressing a thermosetting compression moulding compound into the mould while enclosing the populated lead frame, coating the underside of the thus populated lead frame by thermal spraying in at least the electrically conducting areas and overlapping also the predominant areas of the spaces, filled with mold compound.

8 Claims, 1 Drawing Sheet

METHOD FOR MANUFACTURING A RIGID POWER MODULE SUITED FOR HIGH-VOLTAGE APPLICATIONS

CROSS REFERENCE TO RELATED APPLICATION

Applicant hereby claims foreign priority benefits under U.S.C. §119 from German Patent Application No. 10 2009 014 794.2 filed on Mar. 28, 2009, the contents of which are incorporated by reference herein.

FIELD OF THE INVENTION

The invention relates to a method for manufacturing a rigid power module suited for high-voltage applications.

BACKGROUND OF THE INVENTION

Power semiconductor modules are until now typically formed by multiple transitions from solder, adhesive, LTB (low temperature bonding), or a permanently flexible thermal-conduction paste that connects the constituent elements like cooling body, heat sink (base plate), substrate, and semiconductor with each other. In the process the semiconductors have to be soldered onto the substrate that mostly consists of several (insulating and metallic) layers, the substrate in turn has to be soldered onto a metal heat sink that, conducting well thermally (and mostly also electrically), represents the heat spreader and finally this heat spreader has to be connected to a cooling body. It is important that the high currents or electrical voltages that are used to operate the power semiconductors cannot reach the cooling body. It is therefore important to create a safe electric insulation and still to ensure a good heat transfer. The substrate is therefore conventionally formed as a thick-layer substrate, DCB or the like, where a ceramic core, e.g. $Al_2O_3$ or AlN or the like as an insulator with good thermal conduction is provided with two structured electrically conducting layers that consist, for example, of copper or thick film pastes. A problem with this type of structure is that the considerable amounts of heat are conducted through one or more transitions of solder or adhesive that embrittle by aging; the heat flow then has to be conducted through cross-sections that are correspondingly smaller and then age even faster.

Rigid power modules are protected against the influence of time and ageing by encapsulation. A method for manufacturing a rigid power module is for example already known from DE 10 2007 020 618 B3 by the applicant, where a compression mould is used to form a mould compound around a lead frame (fixed in the compression mould by a mounting die in the compression mould) in the populated state, during the forming process recesses remain at pre-determined positions and webs of the lead frame can be removed later by the punch that is inserted in the recesses.

The applicant's DE 10 2004 055 534 A1 already discloses a power semiconductor module whose construction is known having a sprayed-on layer of particles that are fused together as an electrically conducting wiring plane, intimately connected with this layer, on the sprayed-on layer. With this module a rigid ceramic substrate is replaced by a metallization. Therefore a solution is sought only for the inside of a module.

SUMMARY OF THE INVENTION

The present invention therefore is to enable a rigid power module, such as for automotive applications, in particular in the case of hybrid vehicles, to be provided with the necessary firmly bonded link to the module body and to be precise in a thermally conducting, electrically insulating, but in particular also water-proof and water-tight manner.

In the case of the modules described above of the prior art a problem was the dielectric strength that can be achieved, i.e. its voltage class.

The lead frame elements which are exposed to the cooling body are tied to a potential in the case of the methods mentioned above and therefore must be insulated electrically from each other and relative to the cooling body.

In the case of the prior art, an insulating paste or an insulating film is placed between the module body with the lead frame elements and the cooling body for this purpose. Lead frame elements are typically spaced apart by 0.5 mm.

Typical heat-conducting films (such as Keratherm® Red) possess a dielectric strength of around 4000 volts/mm. However, this dielectric strength is not applicable when no material connection exists between module and/or lead frame element. In this case the dielectric strength of the creepage distance between the lead frame elements has to be applied and it amounts to only 250 volts (according to DIN EN 60664-1) for 0.5 mm in an inhomogeneous electric field. However a paste has no material connection with the mould body and the lead frame. Therefore the value of the creepage distance must be assumed.

For both cases, pastes and films, the disadvantage therefore consists in the fact that in the best case a positive matching can be achieved. This does not extend the dielectric strength as desired.

Furthermore electric insulation of the lead frame elements relative to the cooling body can be achieved by means of suitable materials (for example Kapton® film), however the heat conduction values then likewise required do not exist.

On top of this, pastes possess a technical disadvantage that under mounting-pressure life-long flowing takes place along the smooth surfaces of module and cooling body. In the case of temperature cycling, the module deformation even leads to the pumping of the paste out of the gap between module and cooling body (the so-called pump-out effect). The disadvantage of both options used according to the prior art is therefore a permanent deterioration of the heat resistance toward the cooling body over time.

Finally it has turned out to be a disadvantage that the thermal properties of pastes and films, even in the case of special materials, are limited to around 0.5 to 5 W/mK. Thus only small heat flows are possible and the semiconductor is damaged by a high operating temperature.

The invention is therefore based on the objective of creating a power module that does not exhibit these disadvantages.

According to the invention this is achieved by a method having the features of the main claim. In the process it is also being made possible that corresponding semiconductors are attached to a lead frame on both sides thermally and electrically by means of soldering, gluing, sintering, wire bonding etc. that are then extrusion coated in a transfer mould process so that the lead frame elements are exposed on the side to the cooling body.

For electrical insulation this lead frame side is coated in an additional step by thermal spraying with a layer that insulates electrically and conducts well thermally and is thus made suitable for high-voltage applications.

Using the features of the main claim a thermal connection is therefore achieved, by a firmly bonded link to the module body on the one hand and by the electric insulation with good thermal conductance of the cooling body on the other hand.

Further features and advantages of the invention will become evident from the following description of a preferred exemplary embodiment. In the drawing

DETAILED DESCRIPTION OF THE PREFERRED EMBODIMENTS

Figure 1:
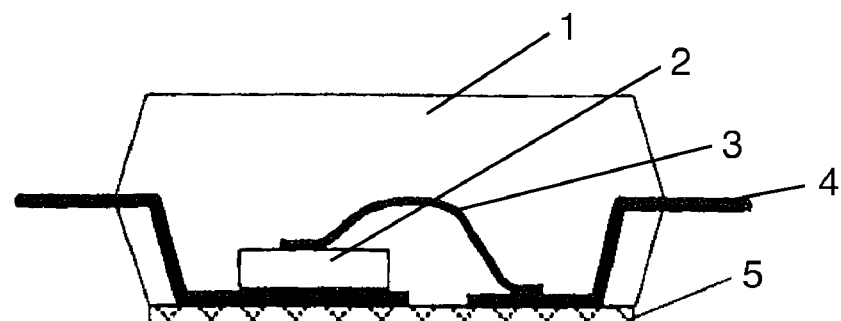
FIG. 1 shows the inventive new structure that differs from the prior art by an additional ceramic insulation layer.
Figure 2:
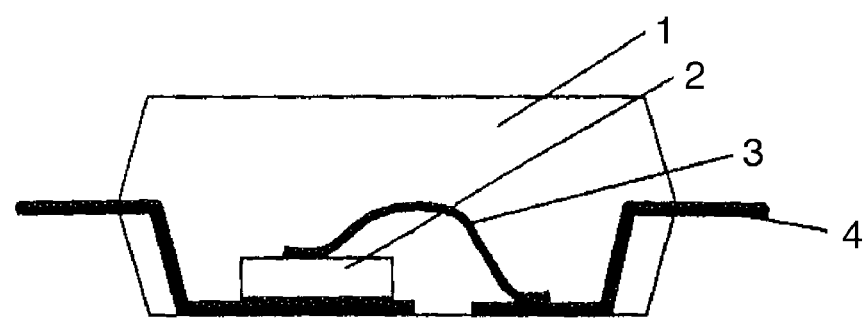
FIG. 2 shows a conventional structure according to the prior art.

The underside of the modules shown in the drawing are coated with a layer that insulates electrically and conducts well thermally, e.g. an oxidic, nitridic, or carbidic ceramic layer (aluminum oxide, aluminum nitride or silicon carbide). These coating materials, as already listed in the DE 10 2004 005 534 A1 mentioned, are preferably applied by thermal spraying, the layer thickness of the insulator depending on the desired dielectric strength and the properties of the chosen ceramic or of the ceramic composite.

By clamping with the rough surfaces, in particular their peak roughnesses relative to each other, creep relative to each other and any form of pump-out effect is prevented, also the thermal-conduction paste and a heat-conducting film clamping each other well in the rough spots.

As a result a paste can no longer be squeezed out by the thermo-mechanical movement of the module. The rough surface of the sprayed ceramic layer 5 offers a two-dimensional spreading of residual gaps and capillaries that cannot be compressed to zero distance and thus stay completely and permanently filled by thermal-conduction pastes.

Preferred Exemplary Embodiment 1

In the case of a preferred embodiment, as can be seen in FIG. 1 in the finished state, a mould module with exposed lead frame tracks 4 is coated, so as to be firmly bonded, with a layer of aluminum oxide in a thickness of around 300 μm by thermal spraying. Such a sprayed layer is insulation resistant up to around 6000 volts.

These layers possess a thermal conductivity of around 24 W/mK and therefore are thermally significantly more conducting than a paste or film.

At the same time as result of the firmly bonded link of the aluminum oxide on the copper of the lead frame 4 and the plastic of the module body 1 a firmly bonded link with the sprayed ceramic takes place.

The insulating ability between lead frame tracks increases in the case of a distance of 0.5 m to 10 000 volts. This enables use in line-voltage applications where the required minimum dielectric strength amounts to >2500 volts.

Preferred Exemplary Embodiment 2

Figure 3:
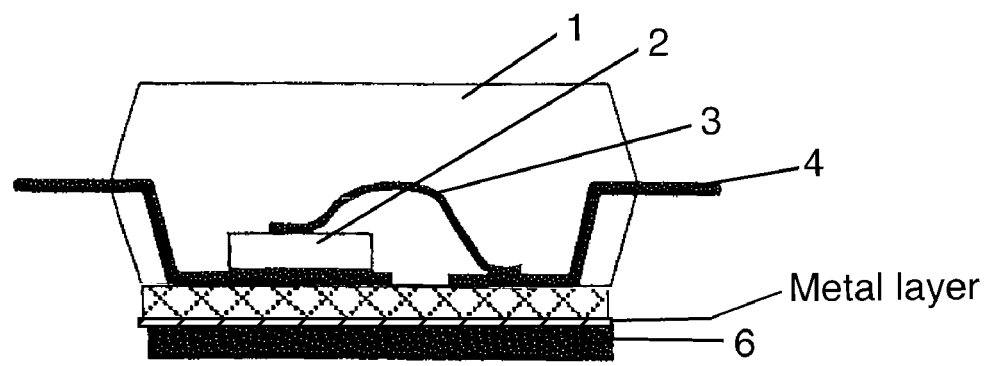
FIG. 3 shows a structure as in FIG. 1 with an additional metal layer sprayed on under the ceramic insulation layer.

In the case of a further preferred embodiment (FIG. 3) a mould module with exposed lead frame tracks 4 can, in addition to a layer 5 of aluminum oxide in a thickness of around 300 μm also be coated so as to be firmly bonded with a further metal layer by thermal spraying.

The at least one further metal layer, for example of Al, Ag, Cu, is applied to the layer of aluminum oxide, for example by cold gas spraying. Thus the mould module with a layer sequence ceramic—metal is in a position to enable a firmly bonded connection to a metallic cooling body 6 by soldering or pressure sintering. In this preferred embodiment the heat flow from module to cooling body through such a firmly bonded connection is in many cases better than through a paste layer and is therefore to be preferred if applicable.

The reference mark 2 designates the semiconductor, 3 the wire bond there upon.

While the present invention has been illustrated and described with respect to a particular embodiment thereof, it should be appreciated by those of ordinary skill in the art that various modifications to this invention may be made without departing from the spirit and scope of the present invention.

What is claimed is:

1. A method for manufacturing a rigid power module with a layer that is electrically insulating and conducts well thermally and has been deposited as a coating, the layer having sprayed-on particles that are fused to each other, of at least one material that is electrically insulating and conducts well thermally, having the following steps:
    manufacturing a one-piece lead frame;
    populating the lead frame with semiconductor devices, possible passive components, and bonding corresponding connections,
    inserting the thus populated lead frame into a compression mould so that accessibility of part areas of the lead frame is ensured,
    pressing a thermosetting compression moulding compound into the compression mould while enclosing the populated lead frame and
    coating the underside of the thus populated lead frame by thermal spraying in at least the electrically conducting areas and extending also over the majority of the area of the spaces between the electrically conducting areas that are filled with mould compound.

2. The method according to claim 1 wherein the coating is deposited by thermal spraying.

3. The method according to claim 1, wherein during coating an electrically insulating substance containing aluminum is deposited.

4. The method according to claim 3, wherein the substance contains aluminum oxide.

5. The method according to claim 3, wherein the substance contains aluminum nitride.

6. The method according to claim 2, wherein the coating contains silicon carbide.

7. The method according to claim 1, wherein the layer remains rough on the free outer side.

8. The method according to claim 1, wherein the one additional metallic layer is deposited on the outside of the insulating, thermally sprayed layer.

* * * * *